(12) United States Patent
Watanabe et al.

(10) Patent No.: US 7,319,268 B2
(45) Date of Patent: Jan. 15, 2008

(54) SEMICONDUCTOR DEVICE HAVING CAPACITORS FOR REDUCING POWER SOURCE NOISE

(75) Inventors: Masaki Watanabe, Tokyo (JP); Shinji Baba, Tokyo (JP)

(73) Assignee: Renesas Technology Corp, Tokyo (JP)

( * ) Notice: Subject to any disclaimer, the term of this patent is extended or adjusted under 35 U.S.C. 154(b) by 0 days.

(21) Appl. No.: 11/797,544

(22) Filed: May 4, 2007

(65) Prior Publication Data

US 2007/0205505 A1 Sep. 6, 2007

Related U.S. Application Data

(62) Division of application No. 11/064,822, filed on Feb. 25, 2005, now Pat. No. 7,233,065, which is a division of application No. 09/846,272, filed on May 2, 2001, now Pat. No. 6,873,035.

(30) Foreign Application Priority Data

Dec. 15, 2000 (JP) ............................. 2000-382592

(51) Int. Cl.
*H01L 23/02* (2006.01)
(52) U.S. Cl. ................. 257/686; 257/777; 257/E23.057
(58) Field of Classification Search ................. 257/686, 257/777, E23.057
See application file for complete search history.

(56) References Cited

U.S. PATENT DOCUMENTS

| | | |
|---|---|---|
| 3,787,252 A | 1/1974 | Filippazzi et al. |
| 5,138,436 A | 8/1992 | Koepf |
| 5,786,979 A | 7/1998 | Douglass |
| 5,949,140 A | 9/1999 | Nishi et al. |
| 5,994,716 A | 11/1999 | Ikeya et al. |
| 6,150,724 A | 11/2000 | Wenzel et al. |
| 6,222,276 B1 | 4/2001 | Bertin et al. |
| 6,225,699 B1 | 5/2001 | Ference et al. |
| 6,228,682 B1 | 5/2001 | Farooq et al. |
| 6,274,214 B1 | 8/2001 | Chan et al. |
| 6,281,042 B1 | 8/2001 | Ahn et al. |
| 6,313,998 B1 | 11/2001 | Kledzik et al. |
| 6,369,444 B1 | 4/2002 | Degani et al. |
| 6,369,448 B1 | 4/2002 | McCormick |
| 6,400,008 B1 | 6/2002 | Farnworth |
| 6,413,353 B2 | 7/2002 | Pompeo et al. |
| 6,418,029 B1 | 7/2002 | McKee et al. |
| 6,611,434 B1 | 8/2003 | Lo et al. |
| 6,768,205 B2 | 7/2004 | Taniguchi et al. |
| 2001/0024360 A1 | 9/2001 | Hirata et al. |
| 2003/0205826 A1 | 11/2003 | Lin et al. |

FOREIGN PATENT DOCUMENTS

| | | |
|---|---|---|
| JP | 58-218152 | 12/1983 |
| JP | 2-37761 | 2/1990 |
| JP | 4-239168 | 8/1992 |
| JP | 5-82714 | 4/1993 |
| JP | 6-37249 | 2/1994 |
| JP | 9-232513 | 9/1997 |

*Primary Examiner*—Asok Kumar Sarkar
(74) *Attorney, Agent, or Firm*—McDermott Will & Emery LLP

(57) ABSTRACT

A semiconductor device comprises a BGA substrate having one principal plane furnished with a large number of solder balls, the solder balls constituting a ball grid array; a semiconductor chip mounted on another principal plane of the BGA substrate, the semiconductor chip being electrically connected to the BGA substrate by metal wires; and chip capacitors mounted on the semiconductor chip to reduce power source noise.

6 Claims, 9 Drawing Sheets

US 7,319,268 B2

SEMICONDUCTOR DEVICE HAVING CAPACITORS FOR REDUCING POWER SOURCE NOISE

RELATED APPLICATIONS

This application is a divisional of U.S. patent application Ser. No. 11/064,822 filed Feb. 25, 2005, now U.S. Pat. No. 7,233,065 which is a divisional of U.S. patent application Ser. No. 09/846,272, filed May 2, 2001, now U.S. Pat. No. 6,873,035, and claims priority of Japanese Patent Application No. 2000-382592, filed Dec. 15, 2000, the contents of which are hereby incorporated by reference.

BACKGROUND OF THE INVENTION

1. Field of the Invention

The present invention relates to a semiconductor device and, more particularly, to a semiconductor device which handles signals at high speed, and to a semiconductor device which has capacitors for reducing power source noise.

2. Description of the Background Art

FIG. 22 is a perspective view for describing a typical structure of a conventional semiconductor device of the above type. FIG. 23 is a cross-sectional view for describing the semiconductor device shown in FIG. 22. In these FIGS. 22 and 23, reference numeral 1 indicates a system substrate on which to mount components. Reference numeral 2 indicates a BGA (ball grid array) substrate mounted on the system substrate 1. As is well known, numerous solder balls 3 are interposed between the BGA substrate 2 and a principal plane of the system substrate 1 to keep the two substrates fixed and electrically connected. Reference numeral 4 indicates a semiconductor chip mounted on the BGA substrate 2. As shown in FIG. 23, bumps 5 are interposed between the semiconductor chip 4 and a principal plane of the BGA substrate 2 to have the chip and substrate fixed and electrically connected.

Reference numeral 6 indicates chip capacitors mounted on the system substrate 1 and BGA substrate 2. A large number of chip capacitors 6 are interposed connectively between power supply terminals (not shown) on a semiconductor device that handles signals at high speed; these chip capacitors 6 are provided to reduce power source noise and thereby to stabilize voltage levels of the power source and ground.

Given the above constitution, one disadvantage of the conventional semiconductor device is that the chip capacitors 6 are located away from the semiconductor chip 4. Therefore, as the speed of signals, which are handled by the semiconductor device, is higher, the inductance between the semiconductor chip 4 and the chip capacitors 6 becomes higher. The growing inductance progressively reduces the immunity of the chip to power source noise.

Another disadvantage is that the flow of high-speed signals generates electromagnetic waves from the semiconductor chip 4, its package, or its mounting substrate. When reaching nearby electronic equipment, the electromagnetic waves can induce electric currents therein by electromagnetic induction, triggering a malfunction at times.

Further, semiconductor chips are mounted on the system substrate basically in a two-dimensional manner. This leads to another problem: semiconductor chips, as they are designed to become ever higher in performance, incorporate a growing number of I/O terminals which translate into an ever-greater external size. On that extended component scale, differences in thermal expansion coefficient between the semiconductor chip 4 and the system substrate 1 can result in a warped substrate or dislodged terminals. Here, "dislodged terminals" means that the accuracy of location of terminals is changed for worse.

Therefore, above-mentioned flaws make it difficult to mount semiconductor chips 4 precisely on the system substrate 1. The yield rate of the chip 4 thus tends to decline and the reliability of mounting worsens.

The BGA type semiconductor device is at its limit of fabrication when coming to measure about 40 mm per side. When large-sized devices carry numerous terminals, they may adopt a pin grid array structure. The pin grid array structure, however, requires installing a socket between the semiconductor chip and the mounting substrate, which raises fabrication costs.

Multi-chip modules (MCM) have different external shapes and different numbers of terminals from one system to another. Such diversities make it difficult for the modules to share sockets and substrates between them. This is another factor pushing up the costs involved.

Another problem with the BGA type is that the module or chip is not receptive to what is known as rework. That is, considerable difficulties are experienced when a semiconductor device or MCM is dismounted from the system substrate for repair or for replacement with a new one having higher performance and the repaired or a replacement device is again mounted onto the system substrate.

Furthermore, the heat dissipating structure of the BGA type leaves much to be desired in terms of performance and production costs.

SUMMARY OF THE INVENTION

The present invention has been conceived to solve the previously-mentioned problems and a general object of the present invention is to provide a novel and useful semiconductor device.

A more specific object of the present invention is to reduce power source noise and radio frequency interference, and to implement with high-density, and to rework easily.

The above object of the present invention is attained by a following semiconductor device.

According to a first aspect of the present invention, the semiconductor device comprises a BGA substrate; a semiconductor chip mounted on a principal plane of the BGA substrate, the semiconductor chip being electrically connected to the BGA substrate by metal wires; and chip capacitors mounted on the semiconductor chip to reduce power source noise.

Therefore, inductance between the chip capacitors and the semiconductor chip can be minimized, thereby reducing power source noise effectively. With this structure, a small number of chip capacitors afford sufficient effects of power source noise reduction.

According to second aspect of the present invention, the semiconductor device comprises: a BGA substrate; a first semiconductor chip including bumps and active regions formed on the same side as the bumps, the bumps serving as electrodes attached to one principal plane of the BGA substrate; and a first chip capacitor attached to the active regions of the semiconductor chip or to the opposite side of the active regions, the chip capacitor serving to reduce power source noise.

Therefore, inductance between the first chip capacitor and the first semiconductor chip can be minimized, thereby reducing power source noise effectively. With this structure, a small number of chip capacitors afford sufficient effects of power source noise reduction.

Furthermore, in the case that the first chip capacitor is attached to the active regions, the worsening of electrical characteristics, which may be brought about by the presence of metal wires, can be eliminated. On the contrary, in the case that the first chip capacitor is attached to the opposite side of the active regions, higher degrees of freedom in determining the size and mounting locations of chip capacitors can be attained. Thus, power source and ground characteristics can be improved efficiently at low cost.

According to third aspect of the present invention, the semiconductor device comprises a semiconductor chip including bumps and active regions, the bumps serving as electrodes and being formed on one principal plane of the semiconductor chip, the active regions being formed on the opposite side as the bumps; wherein chip capacitors can be attached to the active regions of the semiconductor chip, and the chip capacitors are served to reduce power source noise.

Therefore, testing of chip capacitors can be performed easily. Further, a sure connection-between the chip capacitors and the semiconductor chip can be attained. Furthermore, since testing can be carried out readily, it is also easy to rework any defective products (chip capacitors).

DETAILED DESCRIPTION OF THE PREFERRED EMBODIMENTS

Figure 1:
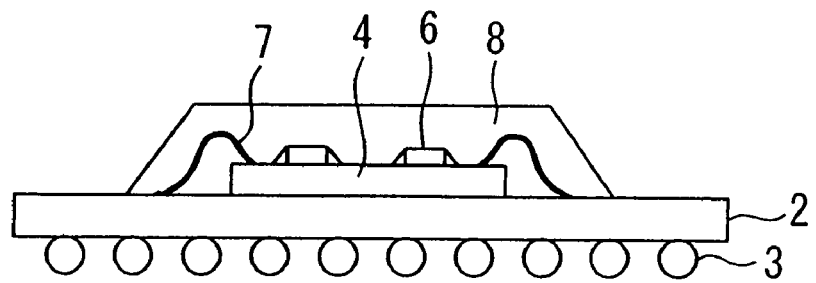
FIG. 1 is a cross-sectional view for describing a typical structure of a semiconductor device according to a first embodiment of the present invention.

In the following, principles and embodiments of the present invention will be described with reference to the accompanying drawings. The members that are common to some of the drawings are given the same reference numerals and redundant descriptions therefore may be omitted.

First Embodiment

The first embodiment of the present invention will now be described with reference to FIG. 1.

FIG. 1 is a cross-sectional view for describing a typical structure of a semiconductor device according to a first embodiment of the present invention. In FIG. 1, reference numeral 2 indicates a BGA (ball grid array) substrate. The BGA substrate 2 is secured onto a mounting substrate (not shown), with numerous solder balls 3 interposed therebetween to ensure inter-substrate electrical connection in a well-known procedure.

Reference numeral 4 indicates a semiconductor chip mounted on the BGA substrate 2. Metal wires 7 provide electrical connection between the semiconductor chip 4 and the BGA substrate 2. Reference numeral 6 indicates chip capacitors provided for the same technical reason as in conventionally devised comparable setups. What characterizes the first embodiment is that the chip capacitors 6 are mounted on the semiconductor chip 4. Reference numeral 8 indicates a mold resin that covers the semiconductor chip 4, metal wires 7, and chip capacitors 6.

As described above, the semiconductor device according to the first embodiment has the chip capacitors 6 mounted on the semiconductor chip.4 to minimize inductance therebetween. This effectively reduces power source noise so as to let high-speed signals be handled more easily than before.

Unlike conventional setups where chip capacitors 6 are positioned away from the semiconductor chip 4, the number of chip capacitors 6 required is significantly reduced in the first embodiment.

Second Embodiment

The second embodiment of the present invention-will now be described with reference to FIG. 2.

Figure 2:
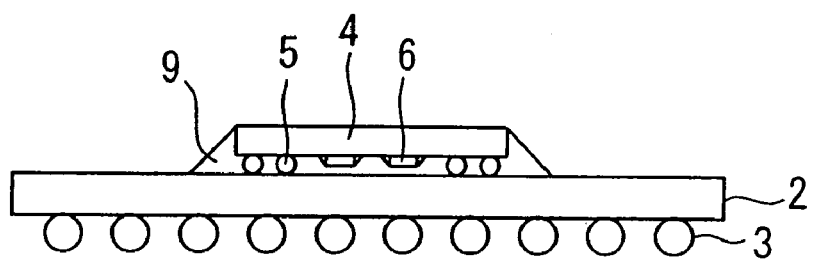
FIG. 2 is a cross-sectional view for describing a typical structure of a semiconductor device according to the second embodiment.

FIG. 2 is a cross-sectional view for describing a typical structure of a semiconductor device according to the second embodiment. In FIG. 2, the component parts having the same or corresponding functions as their counterparts in FIG. 1 are designated by like reference numerals, and their descriptions are omitted where redundant.

What makes the second embodiment different form the setup of FIG. 1 is that bumps 5 are used to connect the semiconductor chip 4 with the BGA substrate 2. In FIG. 2, reference numeral 5 indicates bumps that secures the semiconductor chip 4 onto the BGA substrate 2 while providing electrical connection therebetween.

Whereas the metal wires 7 in the first embodiment of FIG. 1 tend to constitute prolonged connections that may entail worsened electrical characteristics, the bumps 5 eliminate that potential problem.

Because the semiconductor chip 4 furnished with the bumps 5 has active regions (not shown) formed on its lower surface as shown in FIG. 2, the chip capacitors 6 are attached to the bottom of the semiconductor chip 4 as indicated. Reference numeral 9 indicates an under-fill resin.

Third Embodiment

The third embodiment of the present invention will now be described with reference to FIGS. 3 and 4.

Figure 3:
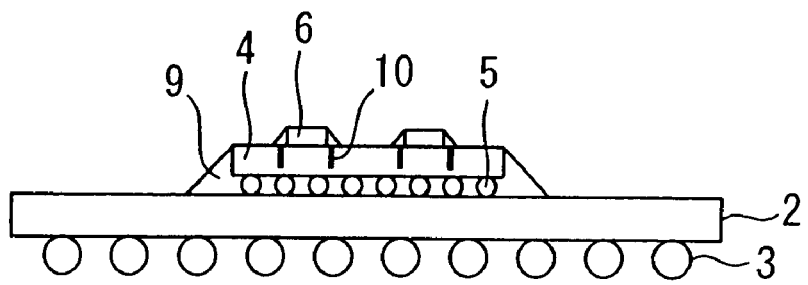
FIG. 3 is a cross-sectional view for describing a typical structure of a semiconductor device according to the third embodiment.

FIG. 3 is a cross-sectional view for describing a typical structure of a semiconductor device according to the third embodiment. In FIG. 3, the component parts having the same or corresponding functions as their counterparts in FIG. 2 are designated by like reference numerals, and their descriptions are omitted where redundant.

What differentiates the third embodiment from the setup of FIG. 2 is that while chip capacitors 6 are attached to the back of the semiconductor chip 4, a plurality of through-type via contacts 10 are used to ensure electrical connection between the chip capacitors 6 and active regions of the semiconductor chip 4. In FIG. 3, reference numeral 6 indicates chip capacitors 6. The chip capacitors 6 are mounted on the top, as shown in FIG. 3, which in fact constitutes the back of the semiconductor chip 4.

Reference numeral 10 indicates through-type via contact that extend from the upper to the lower surface of the semiconductor chip 4 as shown in FIG. 3. The through-type via contacts 10 ensure electrical connection between both ends of the chip capacitors 6 on the one hand and active regions (not shown) of the semiconductor chip 4 on the other hand.

Figure 4:
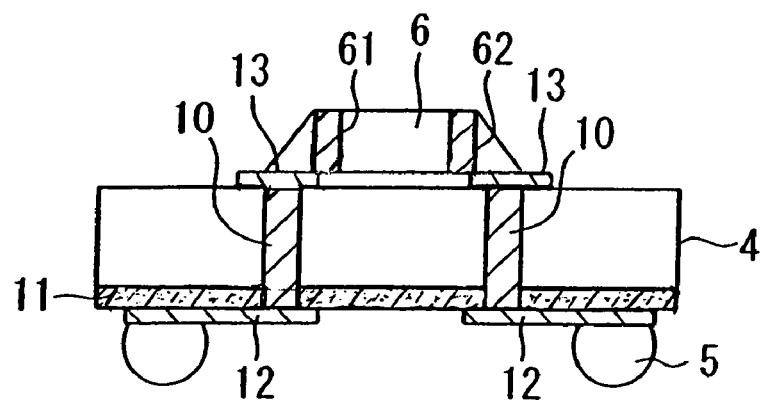
FIG. 4 is a cross-sectional view for describing a typical structure of the through-type via contacts in the third embodiment.

FIG. 4 is a cross-sectional view for describing a typical structure of the through-type via contacts in the third embodiment.

In FIG. 4, reference numeral 4 indicates a semiconductor chip; 11 indicates active regions of the semiconductor chip 4; 10 indicates through-type via contacts that extend from the active regions 11 of the semiconductor chip 4 to its back; and 12 indicates on-chip metal wiring which, mounted on the active regions 11, is connected to appropriate locations of the active regions 11 as well as to lower ends of the through-type via contacts 10 as seen in FIG. 4. Reference numeral 13 indicates chip back pads which, mounted on the back of the semiconductor chip 4, are connected to upper ends of the through-type via contacts 10 as shown in FIG. 4 and constitute electrodes connected to the chip capacitors 6. Reference numerals 61 and 62 indicate terminal electrodes of the chip capacitors 6. These electrodes 61 and 62 are attached to the back of the semiconductor chip 4 and are connected individually to the chip back pads 13.

The third embodiment, constituted as described above, has the chip capacitors 6 mounted on the back of the semiconductor chip 4 and connected to its active regions 11 by means of the through-type via contacts 10. Therefore, this structure permits higher degrees of freedom in determining the size and mounting locations of chip capacitors 6, whereby power source and ground characteristics are improved efficiently at low cost.

Fourth Embodiment

The fourth embodiment of the present invention will now be described with reference to FIG. 5.

Figure 5:
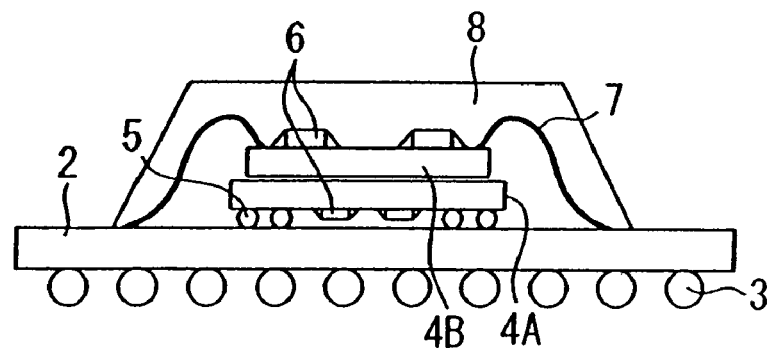
FIG. 5 is a cross-sectional view for describing a typical structure of a semiconductor device according to the fourth embodiment.

FIG. 5 is a cross-sectional view for describing a typical structure of a semiconductor device according to the fourth embodiment. In FIG. 5, the component parts having the same or corresponding functions as their counterparts in FIGS. 1 and 2 are designated by like reference numerals, and their descriptions are omitted where redundant.

What differentiates the fourth embodiment from the set-ups of FIGS. 1 and 2 is that the semiconductor chip 4B of FIG. 1 is mounted on the semiconductor chip 4A of FIG. 2 in a three-dimensional manner with respect to a BGA substrate 2.

In FIG. 5, reference numeral 4A indicates a first semiconductor chip whose structure is shown in FIG. 2; 4B indicates a second semiconductor chip whose structure is shown in FIG. 1, the second semiconductor chip 4B being mounted on the back of the first semiconductor chip 4A; 7 indicates metal wires provided for electrical connection between the second semiconductor chip 4B and the BGA substrate 2; and 8 indicates a mold resin covering the first and second semiconductor chips 4A and 4B as a whole. Namely, the first and second semiconductor chips 4A and 4B, bumps 5, the chip capacitors 6 and the metal wires 7 are covered by the mold resin 8.

The fourth embodiment, constituted as described above, permits packaging of chips with higher density than before to make the system smaller in size. This feature adds advantageously to the improved power source and ground characteristics brought about by mounting the chip capacitors 6 onto the semiconductor chips 4A and 4B.

Since the connective distances between multiple semiconductor chips 4A and 4B installed in layers are shorter than if the chips were laid out in two-dimensional fashion, high-speed signal characteristics are enhanced further.

Fifth Embodiment

The fifth embodiment of the present invention will now be described with reference to FIG. 6.

Figure 6:
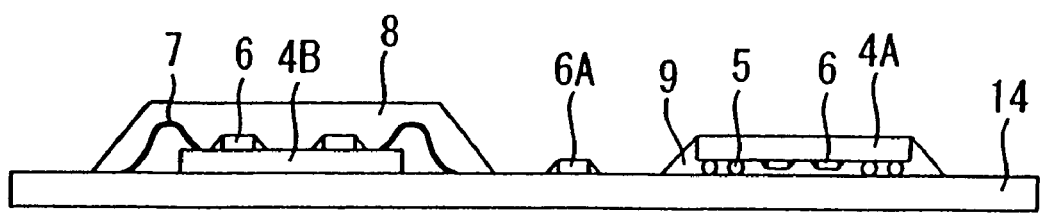
FIG. 6 is a cross-sectional view for describing a typical structure of a semiconductor device according to the fifth embodiment.

FIG. 6 is a cross-sectional view for describing a typical structure of a semiconductor device according to the fifth embodiment. In FIG. 6, reference numeral 14 indicates a module substrate that carries, in two-dimensional fashion, a first semiconductor chip 4A whose structure is shown in FIG. 2 and a second semiconductor chip 4B whose structure is shown in FIG. 1.

The fifth embodiment, constituted as described above, has multiple semiconductor chips 4A and 4B installed two-dimensionally to make up an appreciably thin-shaped system which, admittedly, is not quite susceptible to being reduced in size. One advantage of the present embodiment 5 is that as many semiconductor chips as needed are readily mounted on the module substrate 14 depending on the scale of the system of interest. Another advantage is that chip capacitor 6A shown in FIG. 6 may be attached to the module substrate 14 to stabilize the power source and ground characteristics of the system.

To summarize the above-described semiconductor device, the semiconductor device comprises: a module substrate; a first semiconductor chip including bumps and active regions formed on the same side as the bumps, the bumps serving as electrodes attached to a principal plane of the module substrate; a second semiconductor chip mounted on the principal plane of the module substrate away from the first semiconductor chip, the second semiconductor chip being electrically connected to the module substrate by means of metal wires; chip capacitors attached to s active regions of first semiconductor chip as well as to the second semiconductor chip, the chip capacitors serving to reduce power source noise.

In the semiconductor device, the module substrate may further carries chip capacitors for reducing power source noise.

Sixth Embodiment

The sixth embodiment of the present invention will now be described with reference to FIG. 7.

Figure 7:
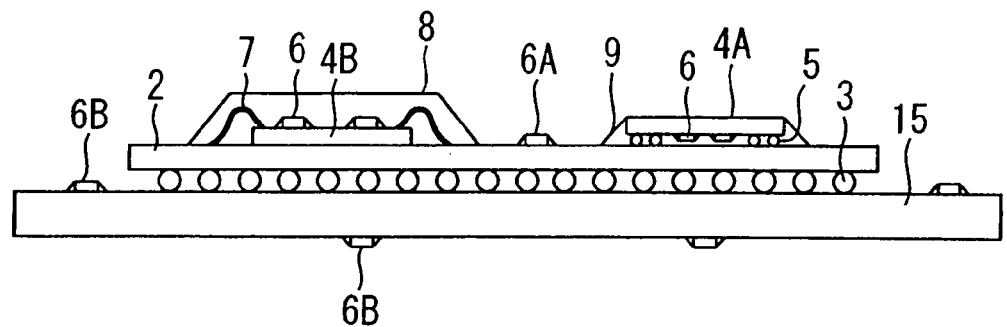
FIG. 7 is a cross-sectional view for describing a typical structure of a semiconductor device according to the sixth embodiment.

FIG. 7 is a cross-sectional view for describing a typical structure of a semiconductor device according to the sixth embodiment. In FIG. 7, the component parts having the same or corresponding functions as their counterparts in FIG. 6 are designated by like reference numerals, and their descriptions are omitted where redundant.

What makes the sixth embodiment different from the setup of FIG. 6 is that solder balls 3 are mounted on the back of a module substrate 14 to constitute a BGA substrate 2 while the BGA substrate 2 carrying a first and a second semiconductor chip 4A and 4B is mounted on a system substrate 15.

In FIG. 7, reference numeral 2 indicates a BGA substrate formed by attaching solder balls 3 to the back of the module substrate 14 in FIG. 6; 15 indicates a system substrate on which the BGA substrate 2 is mounted; and 6B indicates chip capacitors mounted on the system substrate 15.

The sixth embodiment, constituted as described above, has a plurality of module substrates mounted in like manner each onto the system substrate 14 to easily make up a system of a still larger scale. Further, the chip capacitors 6B mounted on the system substrate 15 stabilize the power source and ground characteristics of the system.

To summarize the above-described semiconductor device, the semiconductor device comprises: a system substrate; a ball grid array substrate called the BGA substrate mounted on a principal plane of the system substrate with solder balls interposed therebetween; a first semiconductor chip including bumps and active regions formed on the same side as the bumps, the bumps serving as electrodes attached to a principal plane of the BGA substrate; a second semiconductor chip mounted on the principal plane of the BGA substrate away from the first semiconductor chip, the second semiconductor chip being electrically connected to the BGA substrate by means of metal wires; and chip capacitors attached to the active regions of the first semiconductor chip as well as to the second semiconductor chip, the chip capacitors serving to reduce power source noise.

In the semiconductor device, at least one of the system substrate and the BGA substrate carries chip capacitors for reducing power source noise.

Seventh Embodiment

The seventh embodiment of the present invention will now be described with reference to FIG. 8.

Figure 8:
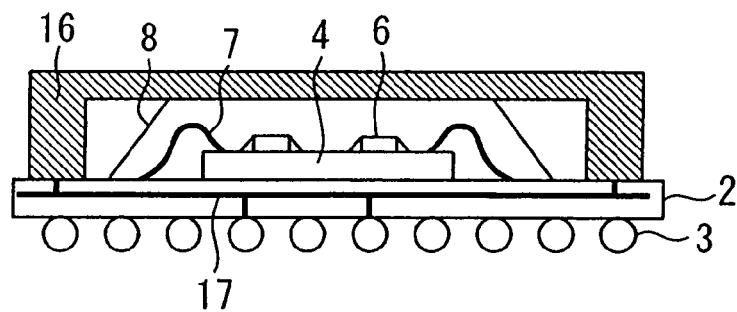
FIG. 8 is a cross-sectional view for describing a typical structure of a semiconductor device according to the seventh embodiment.

FIG. 8 is a cross-sectional view for describing a typical structure of a semiconductor device according to the seventh embodiment. In FIG. 8, the component parts having the same or corresponding functions as their counterparts in FIG. 1 are designated by like reference numerals, and their descriptions are omitted where redundant.

What makes the seventh embodiment different from the setup of FIG. 1 is that the semiconductor chip 4 is covered with a conductive radiator 16 while the BGA substrate 2 incorporates a shield plane 17 for shielding the semiconductor chip 4 in combination with the conductive radiator 16.

In FIG. 8, reference numeral 16 indicates a conductive radiator mounted on a BGA substrate 2 in such a manner that the conductive radiator 16 provides a covering over a semiconductor chip 4 enveloped in a mold resin 8; and numeral 17 indicates a shield plane which is incorporated in the BGA substrate 2 and which constitutes a shield of the semiconductor chip 4 in combination with the conductive radiator 16. The conductive radiator 16 and shield plane 17 are both connected to ground potential.

The seventh embodiment, constituted as described above, reduces power source noise and ground noise while preventing radio frequency interference from inside the conductive radiator 16 and forestalling adverse effects of such interference from outside the conductive radiator 16.

In addition, heat transfer afforded by the conductive radiator 16 and shield plane 17 enhances the characteristics of heat radiation upward as well as downward.

Eighth Embodiment

The eighth embodiment of the present invention will now be described with reference to FIG. 9.

Figure 9:
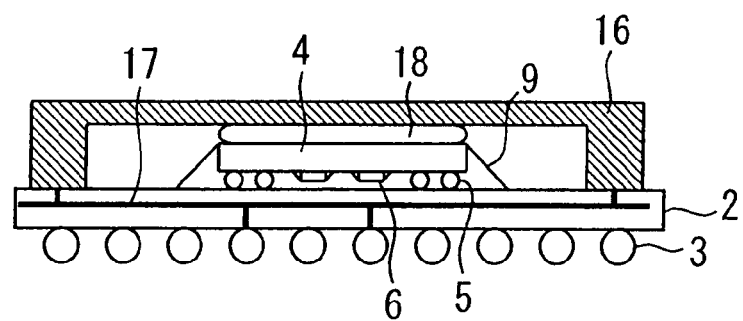
FIG. 9 is a cross-sectional view for describing a typical structure of a semiconductor device according to the eighth embodiment.

FIG. 9 is a cross-sectional view for describing a typical structure of a semiconductor device according to the eighth embodiment. In FIG. 9, the component parts having the same or corresponding functions as their counterparts in FIG. 2 are designated by like reference numerals, and their descriptions are omitted where redundant.

What makes the eighth embodiment different from the setup of FIG. 2 is that the semiconductor chip 4 is covered with a conductive radiator 16 while the BGA substrate 2 incorporates a shield plane 17 for shielding the semiconductor chip 4 in combination with the conductive radiator 16.

In FIG. 9, reference numeral 16 indicates a conductive radiator mounted on a BGA substrate 2 in such a manner that the conductive radiator 16 covers over the semiconductor chip 4; and numeral 17 indicates a shield plane which is incorporated in the BGA substrate 2 and which constitutes a shield of the semiconductor chip 4 in combination with the conductive radiator 16.

The conductive radiator 16 and shield plane 17 are both connected to ground potential. Reference numeral 18 indicates for a heat transfer member such as a heat sinking (radiating) resin installed interposingly between the semiconductor chip 4 and the conductive radiator 16.

The eighth embodiment, constituted as described above, reduces power source noise and ground noise while preventing radio frequency interference from inside the conductive radiator 16 and forestalling adverse effects of such interference from outside the conductive radiator 16.

Heat transfer afforded by the conductive radiator 16 and shield plane 17 enhances the characteristics of heat radiation upward as well as downward. In addition, the heat transfer member 18 transfers heat of the semiconductor chip 4 efficiently to the conductive radiator 16 so that heat sinking performance is enhanced further.

Ninth Embodiment

The ninth embodiment of the present invention will now be described with reference to FIG. 10.

Figure 10:
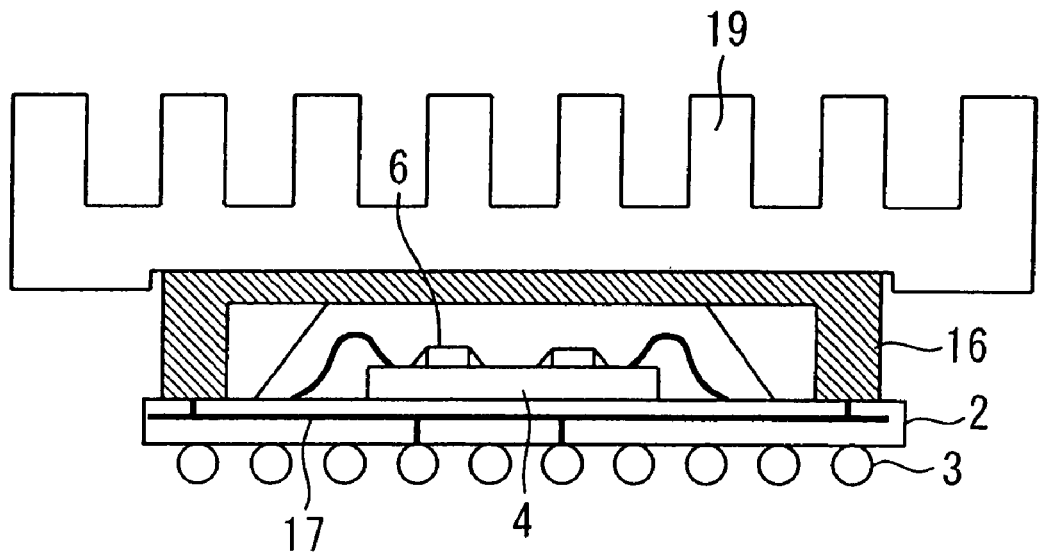
FIG. 10 is a cross-sectional view for describing a typical structure of a semiconductor device according to the ninth embodiment.

FIG. 10 is a cross-sectional view for describing a typical structure of a semiconductor device according to the ninth-embodiment. In FIG. 10, the component parts having the same or corresponding functions as their counterparts in FIG. 8 are designated by like reference numerals, and their descriptions are omitted where redundant.

What makes the ninth embodiment different from the setup of FIG. 8 is that a radiating fin 19 is attached to the outside face of the conductive radiator 16.

In FIG. 10, reference numeral 19 indicates the radiating fin attached to the external surface of the conductive radiator 16.

The above-described structure promotes the heat radiating effect of the conductive radiator 16. Obviously, this type of radiating fin 19 may also be applied to the conductive radiator 16 shown in FIG. 9.

Tenth Embodiment

The tenth embodiment of the present invention will now be described with reference to FIG. 11.

Figure 11:
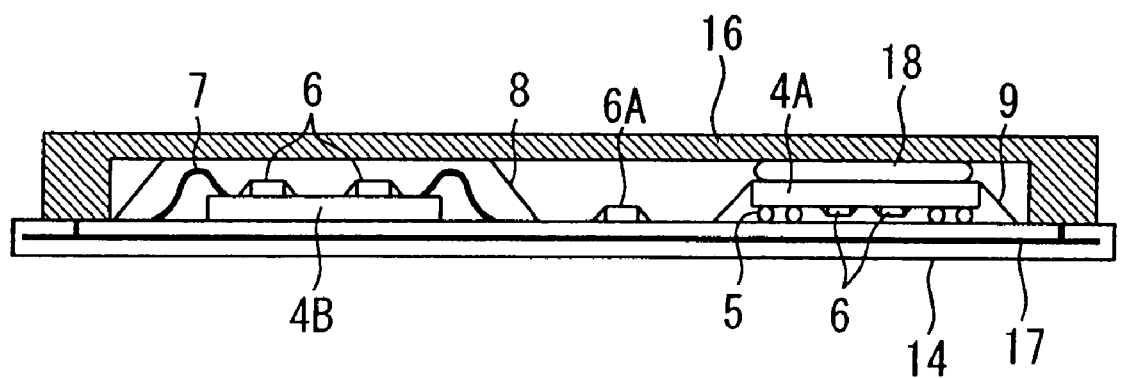
FIG. 11 is a cross-sectional view for describing a typical structure of a semiconductor device according to the tenth embodiment.

FIG. 11 is a cross-sectional view for describing a typical structure of a semiconductor device according to the tenth embodiment. In FIG. 11, the component parts having the same or corresponding functions as their counterparts in FIG. 6 are designated by like reference numerals, and their descriptions are omitted where redundant.

What makes the tenth embodiment different from the setup of FIG. 6 is this: as with the embodiments in FIGS. 8 and 9, a conductive radiator 16 covering a first and a second semiconductor chip 4A and 4B is mounted on a module substrate 14, and the module substrate 14 is arranged to incorporate a shield plane 17. Combined with the conductive radiator 16, the shield plane 17 constitutes a shield of the first and second semiconductor chips 4A and 4B. The conductive radiator 16 and shield plane 17 are connected to ground potential.

Reference numeral 18 indicates a heat transfer member such as a heat sinking (radiating) resin installed interposingly between the first semiconductor chip 4A and the conductive radiator 16.

The tenth embodiment, constituted as described above, can reduce power source noise and ground noise while preventing radio frequency interference from inside the conductive radiator 16 and forestalling adverse effects of such interference from outside the conductive radiator 16.

Heat transfer afforded by the conductive radiator 16 and shield plane 17 enhances the characteristics of heat radiation upward as well as downward. In addition, the heat transfer member 18 transfers heat of the first semiconductor chip 4A efficiently to the conductive radiator 16 so that heat sinking performance is enhanced further.

To summarize the above-described semiconductor device, the semiconductor device according to the fifth embodiment, further comprises: a conductive radiator attached to the principal plane of the module substrate (or the BGA substrate), the conductive radiator covering the first and second semiconductor chips; and a shield plane incorporated in the module substrate, shield plane serving to provide a shield of the first and second semiconductor chips in combination with the conductive radiator; wherein the conductive radiator and the shield plane are connected to ground potential.

The semiconductor device further comprises a heat transfer member interposed between the opposite side of the active regions of the first semiconductor chip and the conductive radiator.

Eleventh Embodiment

The eleventh embodiment of the present invention will now be described with reference to FIG. 12.

Figure 12:
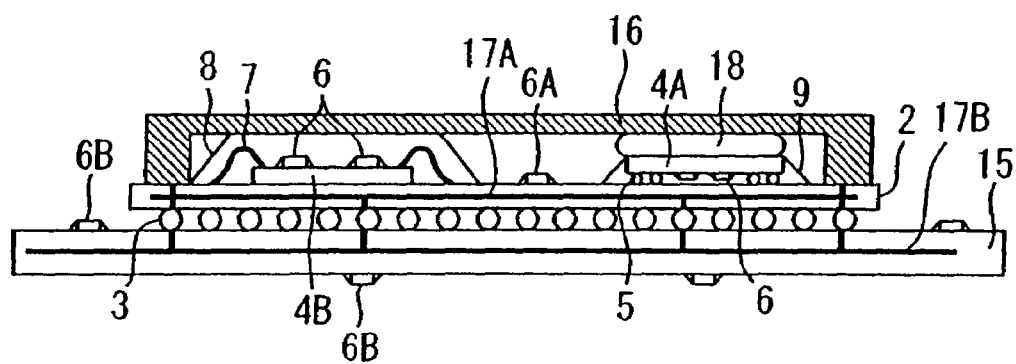
FIG. 12 is a cross-sectional view for describing a typical structure of a semiconductor device according to the eleventh embodiment.

FIG. 12 is a cross-sectional view for describing a typical structure of a semiconductor device according to the eleventh embodiment.

In FIG. 12, the component parts having the same or corresponding functions as their counterparts in FIG. 7 are designated by like reference numerals, and their descriptions are omitted where redundant.

What makes the eleventh embodiment different from the setup of FIG. 7 is this: as with the embodiments in FIGS. 8 and 9, a conductive radiator 16 covering a first and a second semiconductor chip 4A and 4B is mounted on a BGA substrate 2, and the BGA substrate 2 is arranged to incorporate a shield plane 17A which, combined with the conductive radiator 16, constitutes a shield of the first and second semiconductor chips 4A and 4B. A system substrate 15 is also arranged to incorporate a shield plane 17B. The shield plane 17B is similar to the shield plane 17A. The shield planes 17A and 17B are connected to ground potential as well as the conductive radiator 16.

Reference numeral 18 indicates a heat transfer member such as a heat sinking (radiating) resin installed interposingly between the first semiconductor chip 4A and the conductive radiator 16.

The eleventh embodiment, constituted as described above, can reduce power source noise and ground noise while preventing radio frequency interference from inside the conductive radiator 16 and forestalling adverse effects of such interference from outside the conductive radiator 16.

Heat transfer afforded by the conductive radiator 16 and shield planes 17A and 17B enhances the characteristics of heat radiation upward as well as downward. In addition, the heat transfer member 18 transfers heat of the first semiconductor chip 4A efficiently to the conductive radiator 16 so that heat sinking performance is enhanced further.

Twelfth Embodiment

The twelfth embodiment of the present invention will now be described with reference to FIG. 13.

Figure 13:
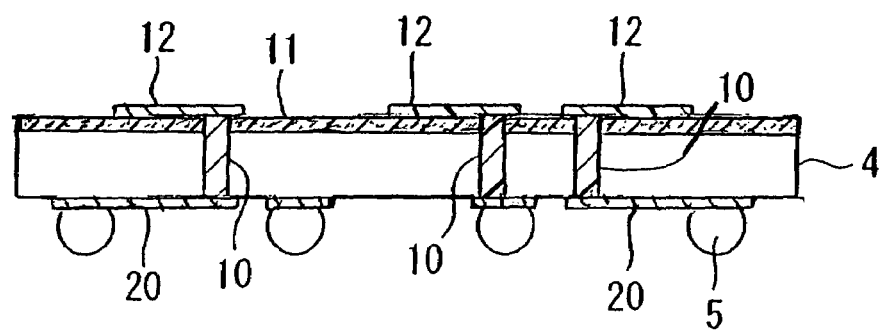
FIG. 13 is a cross-sectional view for describing a typical structure of a semiconductor device according to the twelfth embodiment.

FIG. 13 is a cross-sectional view for describing a typical structure of a semiconductor device according to the twelfth embodiment.

In FIG. 13, reference numeral 4 indicates a semiconductor chip; 5 indicates bumps; 11 indicates active regions of the semiconductor chip 4, and the active regions 11 are formed on the opposite side of the bump mounting surface across the semiconductor chip 4; 10 indicates through-type via contacts extending from the active regions to the bump mounting surface in the semiconductor chip 4; and 12 indicates on-chip metal wiring which, mounted on the active regions 11, is connected to appropriate locations of the active regions 11 as well as to upper ends of the through-type via contacts 10 as seen in FIG. 13, the on-chip metal wiring 12 further constituting connecting electrodes of chip capacitors (not shown).

Reference numeral 20 indicates chip back-mounted metal wiring which, mounted on the bump mounting surface, is connected to the bumps 5 as well as to lower ends of the through-type via contacts 10 as shown in FIG. 13.

The twelfth embodiment, constituted as described above, has the active regions 11 of the semiconductor chip 4 facing upward when the semiconductor chip 4 is mounted on the BGA substrate or the like. This structure allows electrodes such as the on-chip metal wiring 12 to be used for test and chip capacitor connection purposes. Because testing is readily carried out, it is also easy to rework any defective products.

Thirteenth Embodiment

The thirteenth embodiment of the present invention will now be described with reference to FIGS. 14 and 15.

Figure 14:
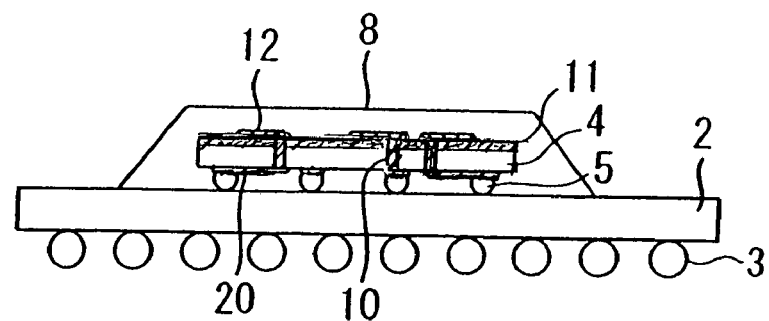
FIG. 14 is a cross-sectional view for describing a typical structure of a semiconductor device according to the thirteenth embodiment.

FIG. 14 is a cross-sectional view for describing a typical structure of a semiconductor device according to the thirteenth embodiment. FIG. 15 is a cross-sectional view for describing a modification of a semiconductor device according to the thirteenth embodiment.

Figure 15:
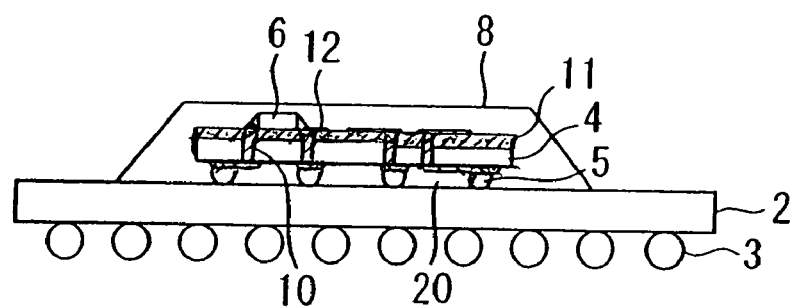
FIG. 15 is a cross-sectional view for describing a modification of a semiconductor device according to the thirteenth embodiment.

In FIGS. 14 and 15, reference numeral 2 indicates a BGA substrate furnished with solder balls 3. The semiconductor device shown in FIG. 13 is mounted on a principal plane of the BGA substrate 2. Reference numeral 8 indicates a mold resin 8 covering the semiconductor device and constituting a package.

In FIG. 14, the component parts having the same or corresponding functions as their counterparts in FIG. 13 are designated by like reference numerals, and their descriptions are omitted where redundant.

The thirteenth embodiment, constituted as described above, has no metal wires and is thus capable of handling signals at higher speed. The benefit of having the active regions 11 facing upward is the same as with the twelfth embodiment. Further, if chip capacitors 6 are connected to the on-chip metal wiring 12 on the active regions 11 as shown in FIG. 15, it is possible to improve the power source and ground characteristics as described above in connection with other embodiments.

Fourteenth Embodiment

The fourteenth embodiment of the present invention will now be described with reference to FIG. 16.

Figure 16:
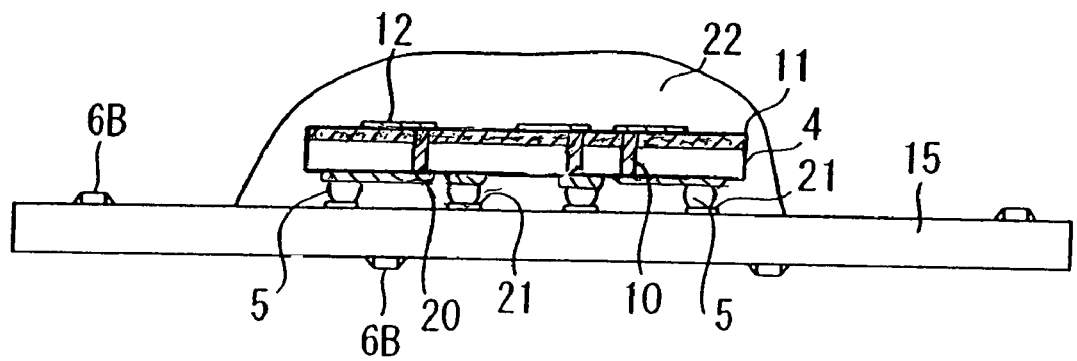
FIG. 16 is a cross-sectional view for describing a typical structure of a semiconductor device according to the fourteenth embodiment.

FIG. 16 is a cross-sectional view for describing a typical structure of a semiconductor device according to the fourteenth embodiment.

In FIG. 16, reference numeral 15 indicates a system substrate that is furnished with numerous mounting pads 21. The semiconductor device, according to the present embodiment, which is sealed, with the semiconductor device of FIG. 13 mounted on the pads 21, by a sealing resin 22. Thus, reliability of packaging can be enhanced.

Because the active regions 11 face upward, it is easy to carry out testing and rework on the inventive semiconductor device. Chip capacitors 6B may be mounted on the system substrate 15. Thus, it is possible to stabilize the power source and ground characteristics of the system constituted by the device.

Fifteenth Embodiment

The fifteenth embodiment of the present invention will now be described with reference to FIGS. 17 and 18.

Figure 17:
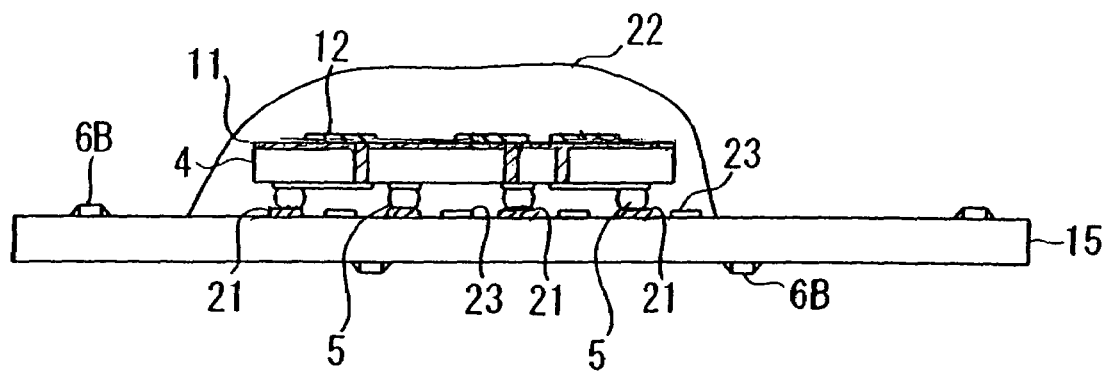
FIG. 17 is a cross-sectional view for describing a typical structure of a semiconductor device according to the fifteenth embodiment.
Figure 18:
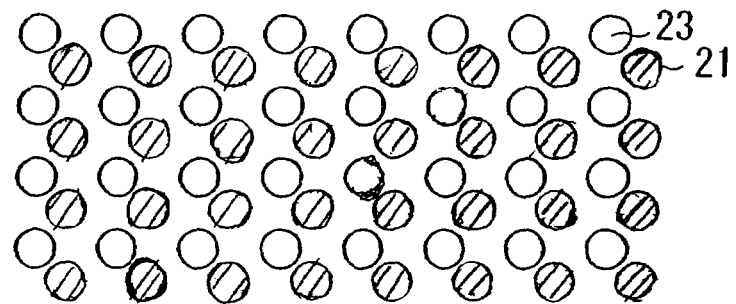
FIG. 18 is a plan view for describing a layout of mounting pads and rework mounting pads in the fifteenth embodiment.

FIG. 17 is a cross-sectional view for describing a typical structure of a semiconductor device according to the fifteenth embodiment. FIG. 18 is a plan view for describing a layout of mounting pads and rework mounting pads in the fifteenth embodiment.

In FIG. 17, the component parts having the same or corresponding functions as their counterparts in FIG. 16 are designated by like reference numerals, and their descriptions are omitted where redundant.

What makes the fifteenth embodiment different from the setup of FIG. 16 is that rework mounting pads 23 are provided on a principal plane of a system substrate 15 in contiguous to mounting pads 21 for easy rework.

In FIG. 17, reference numeral 23 indicates rework mounting pads furnished on a principal plane of a system substrate 15 in a manner contiguous to the mounting pads 21. Namely, as shown in FIG. 18, the mounting pads 21 and the rework mounting pads 23 are furnished on the principal plane of the system substrate 15.

The fifteenth embodiment, constituted as described above, offers the major advantage of making rework easy.

Sixteenth Embodiment

The sixteenth embodiment of the present invention will now be described with reference to FIG. 19.

Figure 19:
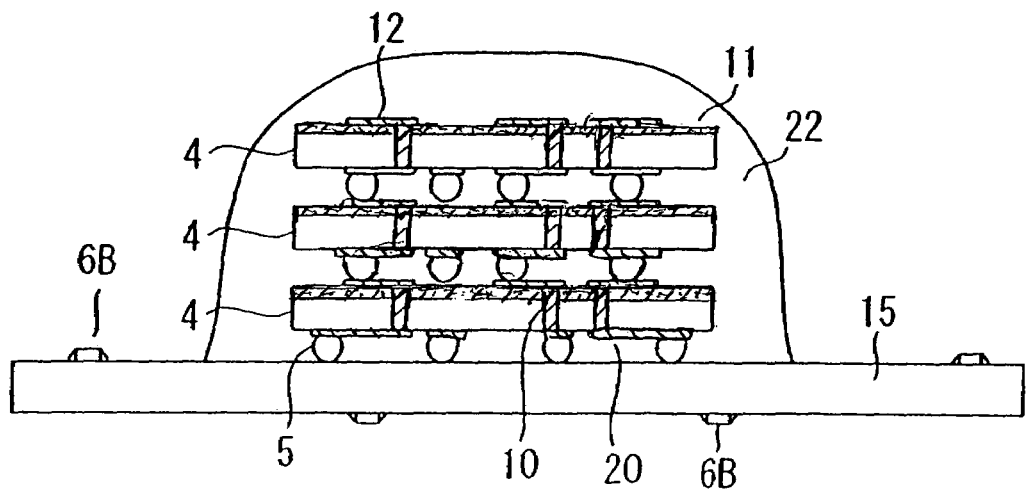
FIG. 19 is a cross-sectional view for describing a typical structure of a semiconductor device according to the sixteenth embodiment.

FIG. 19 is a cross-sectional view for describing a typical structure of a semiconductor device according to the sixteenth embodiment.

The sixteenth embodiment is constituted by having three semiconductor devices (whose structure is shown in FIG. 13) layered on a principal plane of a system substrate 15. In other words, two semiconductor device shown in FIG. 13 are layered on the semiconductor device shown in FIG. 14. The layered three semiconductor devices are sealed by a sealing resin 22. Chip capacitors 6B are attached to the system substrate 15 in the same manner as with other embodiments described so far.

The sixteenth embodiment, constituted as described above, permits three-dimensional mounting of semiconductor devices onto the system substrate 15. Therefore, the system as a whole can be formed on a reduced scale.

This structure also meets high-performance and high-speed signal processing requirements.

Seventeenth Embodiment

The seventeenth embodiment of the present invention will now be described with reference to FIG. 20.

Figure 20:
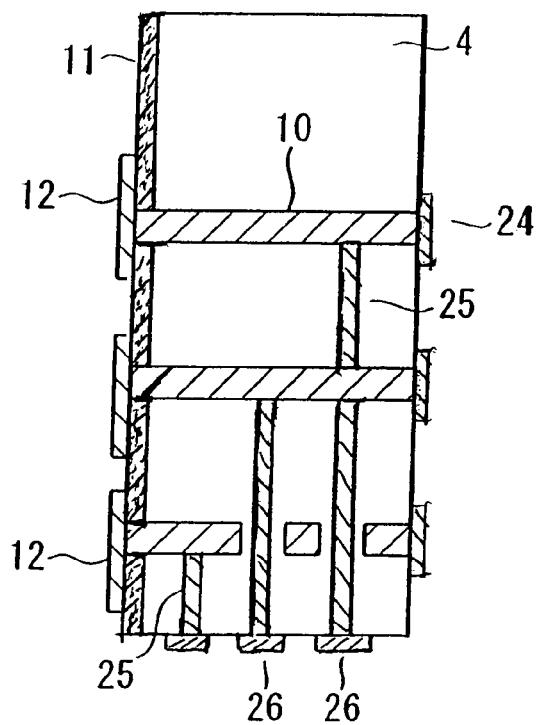
FIG. 20 is a cross-sectional view for describing a typical structure of a semiconductor device according to the seventeenth embodiment.

FIG. 20 is a cross-sectional view for describing a typical structure of a semiconductor device according to the seventeenth embodiment.

In FIG. 20, reference numeral 4 indicates a semiconductor chip; 11 indicates active regions of the semiconductor chip 4, formed on its principal plane; 10 indicates through-type via contacts extending from the active regions 11 of the semiconductor device 4 to its back; and 12 indicates on-chip metal wiring which, mounted on the active regions 11, is connected to appropriate locations of the active regions 11 as well as to left-hand ends of the through-type via contacts 10 as seen in FIG. 20, the on-chip metal wiring 12 constituting connecting electrodes of chip capacitors (not shown). Reference numeral 24 indicates chip back-mounted metal wiring which is mounted on the back of the semiconductor chip 4 and connected to right-hand ends of the through-type via contacts 10 as shown in FIG. 20; 25 indicates lateral via contacts that extend laterally from the semiconductor chip 4 to the through-type via contacts 10 for connection therewith; and 26 indicates lateral pads furnished laterally on the semiconductor chip 4 and connected to lower ends of the lateral via contacts 25 as seen in FIG. 20.

The seventeenth embodiment, constituted as described above, allows the on-chip metal wiring 12 on the active regions 11 to be used as connecting electrodes of chip capacitors (not shown). The chip back-mounted metal wiring 24 at the back is used as testing electrodes, and the lateral pads 26 are utilized as mounting electrodes.

To summarize the above-described semiconductor device, the semiconductor device comprises a semiconductor chip which includes: through-type via contacts extending from one surface to another surface of the semiconductor chip; active regions on one surface thereof; on-chip metal wiring which, mounted on the one surface of the semiconductor chip, is connected to one-side ends of the through-type via contacts and constitutes connecting electrodes of chip capacitors; chip back-mounted metal wiring which, mounted on the another surface of the semiconductor chip, is connected to another-side ends of the through-type via contacts; lateral via contacts extending laterally from the semiconductor chip to the through-type via contacts for connection therewith; and lateral pads which are mounted laterally on the semiconductor chip and are connected to the lateral via contacts.

Eighteenth Embodiment

The eighteenth embodiment of the present invention will now be described with reference to FIG. 21.

Figure 21:
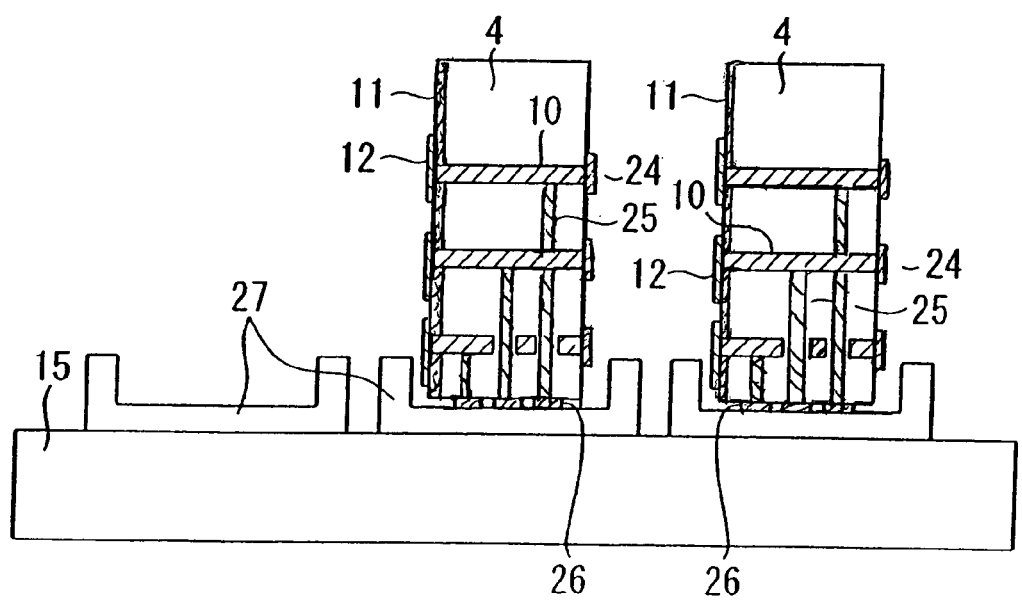
FIG. 21 is a cross-sectional view for describing a typical structure of a semiconductor device according to the eighteenth embodiment.
Figure 22:
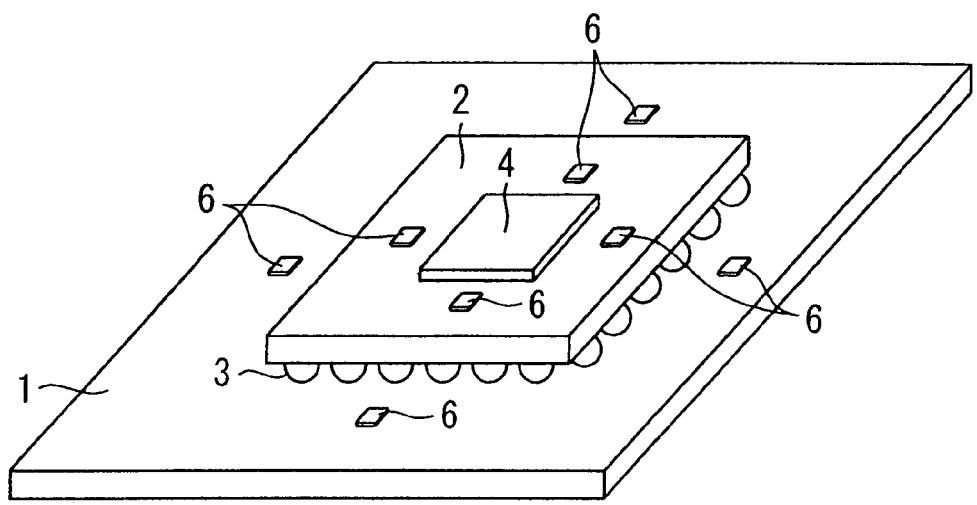
FIG. 22 is a perspective view for describing a typical structure of a conventional semiconductor device of the above type.
Figure 23:
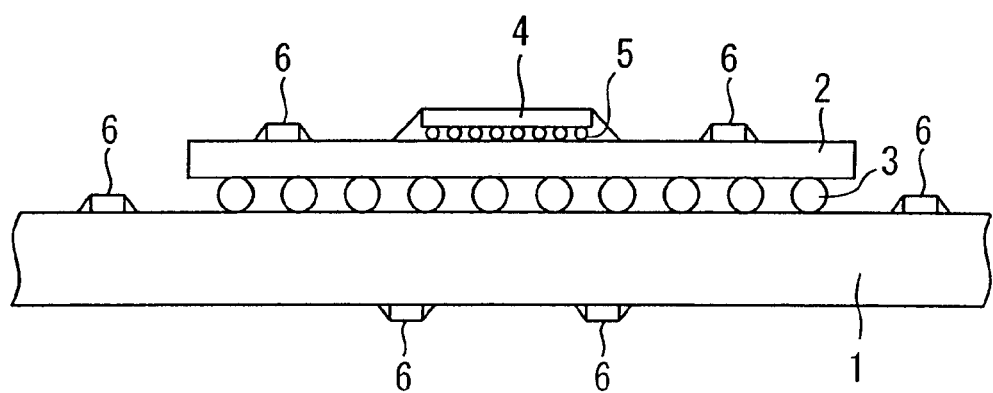
FIG. 23 is a cross-sectional view for describing the semiconductor device shown in FIG. 22.

FIG. 21 is a cross-sectional view for describing a typical structure of a semiconductor device according to the eighteenth embodiment. In FIG. 21, the component parts having the same or corresponding functions as their counterparts in FIG. 20 are designated by like reference numerals, and their descriptions are omitted where redundant.

What makes the eighteenth embodiment different from the setup of FIG. 20 is that semiconductor devices with their structure shown in FIG. 20 are mounted on a system substrate 15.

In FIG. 21, reference numeral 15 indicates a system substrate, and numeral 27 indicates a plurality of connectors mounted on the system substrate 15. As shown in FIG. 21, two semiconductor devices shown in FIG. 20 are connected by means of their lateral pads 26.

The eighteenth embodiment, constituted as described above, allows the semiconductor devices shown in FIG. 20 to be mounted on the system substrate 15 in upright fashion. Therefore, this structure helps form the system of interest on a reduced scale and facilitates rework procedures.

To summarize the above-described semiconductor device, the semiconductor device according to the eighteenth embodiment, further comprises the plurality of connectors formed on the principal plane of the system substrate, the connectors serving to accommodate the lateral pads of the semiconductor device.

This invention, when practiced illustratively in the manner described above, provides the following major effects:

According to first aspect of the invention, there is provided a semiconductor device comprising: a BGA substrate; a semiconductor chip mounted on a principal plane of the BGA substrate with metal wires interposed between the BGA substrate and the semiconductor chip to ensure electrical connection therebetween; and chip capacitors mounted on the semiconductor chip to reduce power source noise.

This structure can minimize inductance between the chip capacitors and the semiconductor chip, thereby reducing power source noise effectively.

With this structure, a small number of chip capacitors afford sufficient effects of power source noise reduction.

According to second aspect of the invention, there is provided a semiconductor device comprising: a BGA substrate; a first semiconductor chip including bumps and active regions formed on the same side as the bumps, the bumps serving as electrodes attached to one principal plane of the BGA substrate; and a first chip capacitor attached to the active regions of the semiconductor chip or to the opposite side of the active regions, the chip capacitor serving to reduce power source noise.

This structure can minimize inductance between the first chip capacitor and the first semiconductor chip, thereby reducing power source noise effectively. With this structure, a small number of chip capacitors afford sufficient effects of power source noise reduction.

Further, in the case that the first chip capacitor is attached to the active regions, the worsening of electrical characteristics, which may be brought about by the presence of metal wires, can be eliminated. In the case that the first chip capacitor is attached to the opposite side of the active regions, higher degrees of freedom in determining the size and mounting locations of chip capacitors can be attained. Thus, power source and ground characteristics can be improved efficiently at low cost.

In a preferred variation of the first aspect of the present invention, the semiconductor device further comprising: a second semiconductor chip mounted on the opposite side of the active regions of the first semiconductor chip, with metal wires interposed between the BGA substrate and the second semiconductor chip to ensure electrical connection therebetween; and a second chip capacitor attached to the second semiconductor chip as well as a first chip capacitor attached to the active region of the first semiconductor chip, the chip capacitor serving to reduce power source noise. This structure permits packaging of chips with higher density than before to make the system of interest smaller in size.

In another preferred variation of the first aspect of the present invention, the semiconductor device further comprising: a conductive radiator attached to the another principal plane of the BGA substrate, the conductive radiator covering the semiconductor chip; and a shield plane incorporated in the BGA substrate, the shield plane constituting a shield of the semiconductor chip in combination with the conductive radiator; wherein the conductive radiator and the shield plane are connected to ground potential. This preferred structure reduces power source noise and ground noise while preventing radio frequency interference from inside the conductive radiator and forestalling adverse effects of such interference from outside the conductive radiator.

In a preferred variation of the second aspect of the present invention, the semiconductor device further comprising: a conductive radiator attached to the another principal plane of the BGA substrate, the conductive radiator covering the semiconductor chip; and a shield plane incorporated in the BGA substrate, the shield plane constituting a shield of the semiconductor chip in combination with the conductive radiator; wherein the conductive radiator and the shield plane are connected to ground potential. This preferred structure reduces power source noise and ground noise while preventing radio frequency interference from inside the conductive radiator and forestalling adverse effects of such interference from outside the conductive radiator. In addition, the semiconductor device further comprises radiating fins attached to an external surface of the conductive radiator. This preferred structure helps boost heat sinking performance of the conductive radiator.

According to third aspect of the present invention, there is provided a semiconductor device comprising: a semiconductor chip including bumps and active regions, the bumps serving as electrodes and being formed on one principal plane of the semiconductor chip, the active region being formed on the opposite side as the bumps; wherein a chip capacitor can be attached to the active region of the semiconductor chip, the chip capacitor serving to reduce power source noise. Therefore, testing of chip capacitors can be performed easily. Further, a sure connection between the chip capacitors and the semiconductor chip can be attained. Further, since testing is readily carried out, it is also easy to rework any defective products.

In a preferred variation of the third aspect of the present invention, the semiconductor device further comprising: a system substrate; a plurality of mounting pads furnished on one principal plane of the system substrate to ensure electrical connection between the semiconductor chip and the system substrate; a chip capacitor mounted either on the principal plane of the system substrate or on a back thereof, the chip capacitors serving to reduce power source noise; and a sealing resin member for sealing the semiconductor chip; wherein the bumps of the semiconductor chip are attached to the plurality of mounting pads to provide electrical connection between the bumps and the active regions. This structure makes it easy to carry out testing and rework of the chip capacitors. With the chip capacitors mounted on the system substrate, it is possible to stabilize the power source and ground characteristics of the system of interest constituted by the device.

In another preferred variation of the third aspect of the present invention, the semiconductor device further comprising: a plurality of rework mounting pads furnished on the principal plane of the system substrate in contiguous to the mounting pads. This preferred structure facilitates rework procedures.

In further preferred variation of the third aspect of the present invention, the semiconductor device further comprising: a plurality of layered semiconductor chips mounted on the semiconductor chip, each of the layered semiconductor chips including active regions on one surface thereof, bumps on another surface thereof, and a through-type via contact extending from the one surface to the another surface, the active region and the bumps being electrically connected through the through-type via contact. This structure permits three-dimensional mounting of semiconductor devices onto the system substrate so that the system as a whole may be built on a reduced scale.

In a preferred variation of the present invention, a semiconductor device comprising: a module substrate; a first semiconductor chip including bumps and active regions formed on the same side as the bumps, the bumps serving as electrodes attached to a principal plane of the module substrate; a second semiconductor chip mounted on the principal plane of the module substrate away from the first semiconductor chip, the second semiconductor chip being electrically connected to the module substrate by means of metal wires; and chip capacitors attached to the active regions of the first semiconductor chip as well as to the second semiconductor chip, the chip capacitors serving to reduce power source noise. This structure has multiple semiconductor chips installed two-dimensionally to make up an appreciably thin-shaped system which however is not quite susceptible to being reduced in size. The inventive structure allows as many semiconductor chips as needed to be readily mounted on the module substrate depending on the scale of the system of interest.

In a preferred variation of the present invention, a semiconductor device comprising: a system substrate; a BGA substrate mounted on a principal plane of the system substrate with solder balls interposed therebetween; a first semiconductor chip including bumps and active regions formed on the same side as the bumps, the bumps serving as electrodes attached to a principal plane of the BGA substrate; a second semiconductor chip mounted on the principal plane of the BGA substrate away from the first semiconductor chip, the second semiconductor chip being electrically connected to the BGA substrate by means of metal wires; and chip capacitors attached to the active regions of the first semiconductor chip as well as to the second semiconductor chip, the chip capacitors serving to reduce power source noise. This structure allows the system of interest to be built with ease on a large scale.

In a preferred variation of the present invention, a semiconductor device comprising a semiconductor chip which includes: through-type via contacts extending from one surface to another surface of the semiconductor chip; on-chip metal wiring which, mounted on the one surface of the semiconductor chip, is connected to one-side ends of the through-type via contacts and constitutes connecting electrodes of chip capacitors; chip back-mounted metal wiring which, mounted on the other surface of the semiconductor chip, is connected to another-side ends of the through-type via contacts; lateral via contacts extending laterally from the semiconductor chip to the through-type via contacts for connection therewith; and lateral pads which are mounted laterally on the semiconductor chip and are connected to the lateral via contacts. This structure allows the on-chip metal wiring on the active regions to be used as connecting electrodes of the chip capacitors. The chip back-mounted metal wiring at the back is used as testing electrodes, and the lateral pads are utilized as mounting electrodes.

In a preferred variation of the present invention, the semiconductor may further comprise connectors on a principal plane of a system substrate, the connectors serving to accommodate the lateral pads of the semiconductor device. This preferred structure allows the semiconductor devices to be mounted on the substrate in upright fashion. This helps form the system of interest on a reduced scale and facilitates rework procedures.

Further, the present invention is not limited to these embodiments, but variations and modifications may be made without departing from the scope of the present invention.

The entire disclosure of Japanese Patent Application No. 2000-382592 filed on Dec. 15, 2000 containing specification, claims, drawings and summary are incorporated herein by reference in its entirety.

What is claimed is:

1. A semiconductor device comprising:
   a BGA substrate having one principal plane furnished with a large number of solder balls and a shield plane connected to ground potential;
   a first semiconductor chip having a first side and an opposite side, said first semiconductor chip including bumps and active regions formed on the first side, said first semiconductor chip being attached to another principal plane of said BGA substrate through the bumps; and
   a first chip capacitor attached to the active regions of said first semiconductor chip, wherein a thickness of said first chip capacitor is less than a thickness of the bumps.

2. The semiconductor device according to claim 1, further comprising: a second semiconductor chip mounted on said opposite side of said active regions of said first semiconductor chip, said second semiconductor chip being electrically connected to said BGA substrate by metal wires;
   and a second chip capacitor attached to said second semiconductor chip as well as a first chip capacitor attached to said active region of said first semiconductor chip, said second chip capacitor serving to reduce power source noise.

3. The semiconductor device according to claim 1, further comprising: a conductive radiator attached to said another principal plane of said BGA substrate, said conductive radiator covering said first semiconductor chip.

4. The semiconductor device according to claim 3, further comprising a heat transfer member interposed between said opposite side of said active regions of said semiconductor chip and said conductive radiator.

5. The semiconductor device according to claim 3, further comprising a radiating fin attached to an external surface of said conductive radiator.

6. The semiconductor device according to claim 1, wherein said first chip capacitor is disposed among the bumps.

* * * * *